US012666765B2

(12) United States Patent
Chen et al.

(10) Patent No.: US 12,666,765 B2
(45) Date of Patent: Jun. 23, 2026

(54) LIGHT-EMITTING ELEMENT

(71) Applicant: AUO Corporation, Hsinchu (TW)

(72) Inventors: YinYu Chen, Hsinchu (TW); Yi-Hong Chen, Hsinchu (TW); Chia-An Lee, Hsinchu (TW); Yu-Hsin Huang, Hsinchu (TW); Kuan-Heng Lin, Hsinchu (TW)

(73) Assignee: AUO Corporation, Hsinchu (TW)

( * ) Notice: Subject to any disclaimer, the term of this patent is extended or adjusted under 35 U.S.C. 154(b) by 693 days.

(21) Appl. No.: 18/187,692

(22) Filed: Mar. 22, 2023

(65) Prior Publication Data

US 2024/0204144 A1     Jun. 20, 2024

(30) Foreign Application Priority Data

Dec. 20, 2022    (TW) .................................. 111148855

(51) Int. Cl.
 *H10H 20/84*        (2025.01)
 *H10H 20/01*        (2025.01)
 (Continued)

(52) U.S. Cl.
 CPC .......... *H10H 20/84* (2025.01); *H10H 20/018* (2025.01); *H10H 20/82* (2025.01); *H10W 90/00* (2026.01); *H10H 20/034* (2025.01); *H10H 20/812* (2025.01); *H10H 20/823* (2025.01); *H10H 20/825* (2025.01)

(58) Field of Classification Search
 None
 See application file for complete search history.

(56) References Cited

U.S. PATENT DOCUMENTS

2018/0337304 A1*  11/2018  Fu ......................... H10H 20/819
2020/0313390 A1*  10/2020  Siriani ...................... H01S 5/22
 (Continued)

FOREIGN PATENT DOCUMENTS

CN        101615611       12/2009
CN        109037405       12/2018
 (Continued)

*Primary Examiner* — Bradley Smith
(74) *Attorney, Agent, or Firm* — JCIPRNET

(57) ABSTRACT

A light-emitting element includes a first type semiconductor layer, a second type semiconductor layer, a light-emitting layer, a first electrode, a second electrode, and a multi-layer film. The second type semiconductor layer overlaps the first type semiconductor layer. The light-emitting layer is located between the first type semiconductor layer and the second type semiconductor layer. The first electrode is electrically connected to the first type semiconductor layer and is located on a side of the first type semiconductor layer close to the second type semiconductor layer. The second electrode is electrically connected to the second type semiconductor layer and is located on a side of the second type semiconductor layer facing away from the first type semiconductor layer. The multi-layer film is located on a surface of the first type semiconductor layer facing away from the second type semiconductor layer and has a protrusion portion. The protrusion portion protrudes from a side surface of the first type semiconductor layer. A light-emitting device includes the light-emitting element.

4 Claims, 13 Drawing Sheets

(51) Int. Cl.
   *H10H 20/82*  (2025.01)
   *H10W 90/00*  (2026.01)
   *H10H 20/812*  (2025.01)
   *H10H 20/823*  (2025.01)
   *H10H 20/825*  (2025.01)

(56)              References Cited

U.S. PATENT DOCUMENTS

| | | | |
|---|---|---|---|
| 2021/0091270 A1 | 3/2021 | Ventelon et al. | |
| 2021/0159370 A1* | 5/2021 | Hsu | H10H 20/824 |
| 2021/0265542 A1* | 8/2021 | Ogawa | H01L 25/0753 |
| 2022/0359787 A1* | 11/2022 | Wang | H10H 20/82 |
| 2023/0352623 A1* | 11/2023 | Lin | H10H 20/825 |

FOREIGN PATENT DOCUMENTS

| | | |
|---|---|---|
| CN | 113838842 | 12/2021 |
| TW | 201921714 | 6/2019 |
| TW | 202039754 | 11/2020 |

* cited by examiner

LIGHT-EMITTING ELEMENT

CROSS-REFERENCE TO RELATED APPLICATION

This application claims the priority benefit of Taiwan application serial no. 111148855, filed on Dec. 20, 2022. The entirety of the above-mentioned patent application is hereby incorporated by reference herein and made a part of this specification.

BACKGROUND

Technical Field

The disclosure relates to a photoelectric element and a photoelectronic device including the same, and in particular, to a light-emitting element and a light-emitting device including the same.

Description of Related Art

Micro-LEDs are suitable for building micro-LED light emitting devices, such as micro-LED display devices, due to their low power consumption, high brightness, high resolution, and high color saturation. However, due to the large difference between the refractive index of the semiconductor layer of the micro-LED (about 2.4) and the refractive index of the light-emitting medium (for example, the refractive index of air being 1), the light emitted by the micro-LED is prone to total reflection on the light exiting surface, thereby causing difficulty in improving the light extraction efficiency (LEE) of the micro-LED.

SUMMARY

The disclosure provides a light-emitting element having improved light extraction efficiency.

The disclosure provides a light-emitting device having improved light extraction efficiency.

An embodiment of the disclosure provides a light-emitting element, including: a first type semiconductor layer, a second type semiconductor layer, a light-emitting layer, a first electrode, a second electrode, and a multi-layer film. The second type semiconductor layer overlaps the first type semiconductor layer. The light-emitting layer is located between the first type semiconductor layer and the second type semiconductor layer. The first electrode is electrically connected to the first type semiconductor layer and is located on a side of the first type semiconductor layer close to the second type semiconductor layer. The second electrode is electrically connected to the second type semiconductor layer and is located on a side of the second type semiconductor layer facing away from the first type semiconductor layer. The multi-layer film is located on a surface of the first type semiconductor layer facing away from the second type semiconductor layer and has a protrusion portion. The protrusion portion protrudes from a side surface of the first type semiconductor layer.

In an embodiment of the disclosure, the multi-layer film includes an alternately stacked layer of at least two kinds of material layers, and the refractive indices of the at least two kinds of material layers are different from each other.

In an embodiment of the disclosure, the at least two kinds of material layers have respective refractive index between the refractive index of the first type semiconductor layer and the refractive index of air.

In an embodiment of the disclosure, the materials of the at least two kinds of material layers are selected from aluminum fluoride, magnesium fluoride, silicon oxide, lanthanum fluoride, gadolinium fluoride, aluminum oxide, yttrium oxide, silicon nitride, hafnium oxide, tantalum pentoxide, zirconia, niobium pentoxide, and titanium dioxide.

In an embodiment of the disclosure, the multi-layer film includes multiple sub-layers, and the thicknesses of the multiple sub-layers are different from each other.

In an embodiment of the disclosure, a ratio of a width of the protrusion portion of the multi-layer film to the width of the first type semiconductor layer is 5% to 95%.

In an embodiment of the disclosure, the surface of the first type semiconductor layer facing away from the second type semiconductor layer has multiple notches, and the multi-layer film is bonded to the multiple notches.

In an embodiment of the disclosure, the diameters of the multiple notches are 0.1 μm to 30 μm.

In an embodiment of the disclosure, the light-emitting element further includes a carrier plate. The carrier plate is located on the side of the second type semiconductor layer facing away from the first type semiconductor layer, and the multi-layer film is connected to the carrier plate, so that the first type semiconductor layer, the second type semiconductor layer, the light-emitting layer, the first electrode, and the second electrode are suspended above the carrier plate by means of the multi-layer film.

An embodiment of the disclosure provides a light-emitting device, including: a circuit substrate and multiple light-emitting elements. The multiple light-emitting elements are disposed on the circuit substrate, and each light-emitting element includes a semiconductor stacked layer, a first electrode, a second electrode, and a multi-layer film. The first electrode is located between the semiconductor stacked layer and the circuit substrate and is electrically connected to a first type semiconductor layer in the semiconductor stacked layer and the circuit substrate. The second electrode is located between the semiconductor stacked layer and the circuit substrate and is electrically connected to a second type semiconductor layer in the semiconductor stacked layer and the circuit substrate. The semiconductor stacked layer is located between the multi-layer film and the circuit substrate, and the multi-layer film protrudes from a side surface of the semiconductor stacked layer.

In an embodiment of the disclosure, a light-emitting surface of the semiconductor stacked layer faces the multi-layer film.

In an embodiment of the disclosure, the light-emitting device further includes an optical layer, and the multi-layer film is located between the optical layer and the first type semiconductor layer.

In an embodiment of the disclosure, a refractive index of the optical layer is between a refractive index of a material layer of the multi-layer film and a refractive index of air.

In order to make the above-mentioned features and advantages of the disclosure clearer and easier to understand, the following embodiments are given and described in details with accompanying drawings as follows.

DESCRIPTION OF THE EMBODIMENTS

Figure 1:
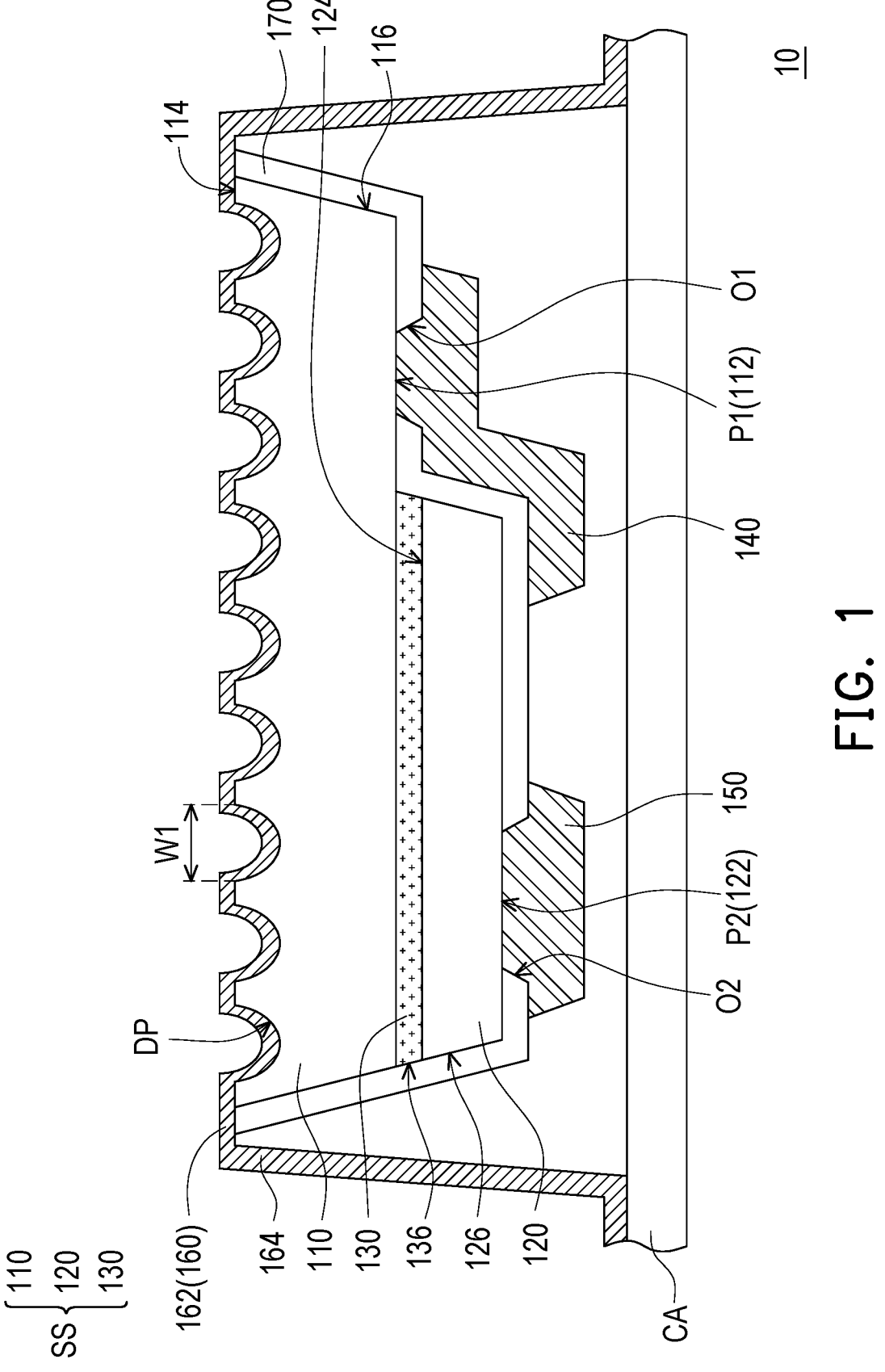
FIG. 1 is a schematic cross-sectional view of a light-emitting element 10 according to an embodiment of the disclosure.

In the drawings, the thickness of layers, films, panels, regions, etc., are exaggerated for clarity's sake. The same reference numerals refer to the same elements throughout the specification. It will be understood that when a component such as a layer, a film, a region, or a substrate is referred to be "on" or "connected to" another component, it may be directly on or connected to the other another component, or intermediate components may also exist there between. Comparatively, when a component is referred to be "directly on" or "directly connected" to another, none other intermediate component exits there between. As used herein, the "connection" may refer to physical and/or electrical connection. Furthermore, "electrical connection" of two components may refer to that other components may exist between the two components.

It should be understood that although the terms "first", "second", "third", etc. may be used for describing various elements, components, regions, layers and/or portions, the elements, components, regions, layers and/or portions are not limited by these terms. These terms are only used for separating one element, component, region, layer or portion from another element, component, region, layer or portion. Therefore, the following discussed "first element", "component", "region", "layer" or "portion" may be referred to as the second element, component, region, layer or portion without departing from the scope of the disclosure.

The terminology used herein is for the purpose of describing particular embodiments and is not intended to be limiting of the disclosure. As used herein, the singular forms "a," "an" and "the" are intended to include the plural forms as well, including "at least one" or represents "and/or", unless the context clearly indicates otherwise. The term "and/or" used herein includes any or a combination of one or more of the associated listed items. It will be further understood that the terms "comprises," "comprising," "includes" and/or "including," when used herein, specify the presence of stated features, regions, integers, steps, operations, elements, and/or components, but do not preclude the presence or addition of one or more other features, regions, integers, steps, operations, elements, components, and/or groups thereof.

Moreover, relative terms such as "under" or "bottom" and "above" or "top" may be used for describing a relationship of one element and another element as that shown in figures. It should be noted that the relative terms are intended to include a different orientation of the device besides the orientation shown in the figure. For example, if a device in a figure is flipped over, the element originally described to be located "under" other element is oriented to be located "above" the other element. Therefore, the illustrative term "under" may include orientations of "under" and "on", which is determined by the specific orientation of the figure. Similarly, if a device in a figure is flipped over, the element originally described to be located "below" or "underneath" other element is oriented to be located "on" the other element. Therefore, the illustrative term "under" or "below" may include orientations of "above" and "under".

Considering the discussed measurement and a specific number of errors associated with the measurement (i.e., limitations of the measurement system), the terms "about", "substantial" or "approximate" used herein include the related value and an average within an acceptable deviation range for a specific value determined by those skilled in the art. For example, "about" may represent a range within one or a plurality of standard deviations of the related value, or within +30%, +20%, +10%, +5%. Moreover, the "about", "substantially", or "approximate" used herein may be a more acceptable deviation range or standard deviation based on optical properties, etching properties, or other properties, and not one standard deviation may be applied to all properties.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The exemplary embodiment is described below with reference of a cross-sectional view of a schematic diagram of an idealized embodiment. Therefore, a shape change of the figure serving as a result of manufacturing techniques and/or tolerances may be expected. Therefore, the embodiment of the disclosure should not be construed as limited to a particular shape of a region as shown herein, but includes a shape deviation caused by manufacturing tolerance. For example, a shown or described flat area may generally have rough and/or non-linear features. Moreover, a shown acute angle may be round. Therefore, a region shown in the figure is essentially schematic, and a shape thereof is not intended to show an accurate shape of the region, and is not intended to limit a range of the claims of the disclosure.

FIG. 1 is a schematic cross-sectional view of a light-emitting element 10 according to an embodiment of the disclosure. Hereinafter, the implementation of each element of the light-emitting element 10 will be described with reference to FIG. 1, but the disclosure is not limited thereto.

Referring to FIG. 1, the light-emitting element 10 may include a semiconductor stacked layer SS, a first electrode 140, a second electrode 150, and a multi-layer film 160. In some embodiments, the first electrode 140 and the second electrode 150 are located on the same side of the semiconductor stacked layer SS, but the disclosure is not limited thereto. In some embodiments, the first electrode 140 and the second electrode 150 are located on different sides of the semiconductor stacked layer SS. In some embodiments, the multi-layer film 160 is located on a side of the semiconductor stacked layer SS that is different from the first electrode 140 and the second electrode 150. In some embodiments, the semiconductor stacked layer SS includes a first type semiconductor layer 110, a second type semiconductor layer 120, and a light-emitting layer 130, and the light-emitting layer 130 is located between the first type semiconductor layer 110 and the second type semiconductor layer 120.

The first type semiconductor layer 110 may overlap the second type semiconductor layer 120. In some embodiments, the first type semiconductor layer 110 has a surface 112 close to or facing the second type semiconductor layer 120 and a surface 114 facing away from the second type semiconductor layer 120, and the light-emitting layer 130 is sandwiched between the surface 112 of the first type semiconductor layer 110 and the second type semiconductor layer 120. In some embodiments, the light-emitting layer 130 partially overlaps the surface 112 of the first type semiconductor layer 110, and the second type semiconductor layer 120 completely overlaps the light-emitting layer 130. In other words, the second type semiconductor layer 120 and the light-emitting layer 130 do not cover a part of the surface 112 of the first type semiconductor layer 110. In some embodiments, the second type semiconductor layer 120 has a surface 122 facing away from the first type semiconductor layer 110 and a surface 124 close to or facing the first type semiconductor layer 110, and the light-emitting layer 130 is sandwiched between the surface 112 of the first type semiconductor layer 110 and the surface 124 of the second type semiconductor layer 120.

The first type semiconductor layer 110 may include an N-type doped semiconductor material, such as an N-type group II-VI material (e.g., zinc selenide (ZnSe)), an N-type group III-V nitride material (e.g., gallium nitride (GaN), aluminum nitride (AlN), indium nitride (InN), indium gallium nitride (InGaN), aluminum gallium nitride (AlGaN), or aluminum indium gallium nitride (AlInGaN)), or a stack thereof. The second type semiconductor layer 120 may include a P-type doped semiconductor material, such as a P-type group II-VI material, a P-type group III-V nitride material, or a stack thereof. The light-emitting layer 130 may include a multi-layer quantum well structure (MQW), and the multiple quantum well structure may include an alternately stacked multi-layer group II-VI material and multi-layer group III-V nitride material, but the disclosure is not limited thereto. In some embodiments, the light-emitting element 10 is a micro light-emitting diode (μ-LED). In some embodiments, the light-emitting element 10 is a flip chip micro light-emitting diode.

In some embodiments, the light-emitting element 10 further includes an insulation layer 170, and the insulation layer 170 does not cover the surface 114 of the first type semiconductor layer 110. For example, the insulation layer 170 covers a side surface 116 and a part of the surface 112 of the first type semiconductor layer 110, a side surface 136 of the light-emitting layer 130, and a side surface 126 and a part of the surface 122 of the second type semiconductor layer 120, and the insulation layer 170 may have an opening O1 and an opening O2. The opening O1 exposes a portion P1 of the surface 112 of the first type semiconductor layer 110, and the opening O2 exposes a portion P2 of the surface 122 of the second type semiconductor layer 120.

The first electrode 140 of the light-emitting element 10 may be electrically connected to the first type semiconductor layer 110, and the second electrode 150 of the light-emitting element may be electrically connected to the second type semiconductor layer 120. In some embodiments, the first electrode 140 is disposed on the surface 112 of the first type semiconductor layer 110, and the first electrode 140 is electrically connected to the portion P1 of the surface 112 of the first type semiconductor layer 110 through the opening O1. In some embodiments, the second electrode 150 is disposed on the surface 122 of the second type semiconductor layer 120, and the second electrode 150 is electrically connected to the portion P2 of the surface 122 of the second type semiconductor layer 120 through the opening O2. For example, the materials of the first electrode 140 and the second electrode 150 may include metals with good conductivity, such as aluminum (Al), titanium (Ti), gold (Au), platinum (Pt), nickel (Ni), chromium (Cr), alloys of the above metals, or combinations or stacked layers of the above metals and/or alloys. For example, the first electrode 140 or the second electrode 150 may include metal stacked layers such as Ti/Au, Ti/Al/Ti/Au, or Cr/Al/Ti/Pt/Au.

The multi-layer film 160 may be disposed on the surface 114 of the first type semiconductor layer 110, and a protrusion portion 162 of the multi-layer film 160 may extend beyond the surface 114. In some embodiments, the protrusion portion 162 overlaps the side of the first type semiconductor layer 110, and in the extension direction of the surface 114, the protrusion portion 162 extends beyond the side surface 116 of the first type semiconductor layer 110 and protrudes from the side surface 116. The multi-layer film 160 may be an anti-reflective layer. In some embodiments, the multi-layer film 160 includes an alternately stacked layer of at least two kinds of material layers, and the refractive indices of the at least two kinds of material layers are different from each other. In some embodiments, the refractive indices of the at least two kinds of material layers of the multi-layer film 160 are each independently between the refractive index of the first type semiconductor layer 110 and the refractive index of air. For example, when the refractive index of the first type semiconductor layer 110 is 2.42, the refractive index of each material layer of the multi-layer film 160 is between 1 and 2.42. In some embodiments, the material of each material layer of the multi-layer film 160 is selected from aluminum fluoride (AlF3, with a refractive index of 1.36), magnesium fluoride (MgF2, with a refractive index of 1.38), silicon oxide (SiO2, with a refractive index of 1.46), lanthanum fluoride (LaF3, with a refractive index of 1.58), gadolinium fluoride (GdF3, with a refractive index of 1.58), aluminum oxide (Al2O3, with a refractive index of 1.77), yttrium oxide (Y2O3, with a refractive index of 1.79), nitride silicon (Si3N4, with a refractive index of 1.8), hafnium oxide (HfO2, with a refractive index of 1.9), tantalum pentoxide (Ta2O5, with a refractive index of 2.04), zirconia (ZrO2, with a refractive index of 2.05), niobium pentoxide (Nb2O5, with a refractive index of 2.25) and titanium dioxide (TiO2, with a refractive index of 2.31). In some embodiments, the thickness of each material layer in the multi-layer film 160 is different from each other, and by adjusting the thickness of each material layer in the multi-layer film 160, constructive interference may be generated after the light enters the multi-layer film 160, thereby improving the light transmittance of the multi-layer film 160. In some embodiments, the surface 114 of the first type semiconductor layer 110 is the light-emitting surface of the light-emitting element 10, and by disposing the multi-layer film 160 on the surface 114 of the first type semiconductor layer 110, the total reflection of the light emitted by the light-emitting element 10 on the surface 114 may be prevented, thereby improving the light extraction efficiency of the light-emitting element 10.

In some embodiments, the surface 114 of the first type semiconductor layer 110 is an uneven surface. For example, the surface 114 of the first type semiconductor layer 110 has multiple notches DP, and the multi-layer film 160 is bonded to each notch DP of the surface 114. In some embodiments, the notch DP is an inverted nano-cone structure left after a laser lift off (LLO) process. In this way, the total reflection of the incident light with a large angle on the surface 114 may be avoided, thereby improving the light extraction efficiency of the light-emitting element 10. In some embodiments, a diameter W1 of the notch DP is 0.1 μm to 30 μm. In some embodiments, the diameters W1 of the multiple notches DP are not completely the same.

In some embodiments, the light-emitting element 10 further includes a carrier plate CA, and the carrier plate CA is located on a side of the second type semiconductor layer 120 facing away from the first type semiconductor layer 110. In some embodiments, the multi-layer film 160 further includes a support portion 164, and the support portion 164 extends from the protrusion portion 162 toward the carrier plate CA to connect to the carrier plate CA, so that the first type semiconductor layer 110, the second type semiconductor layer 120, the light-emitting layer 130, the first electrode 140, the second electrode 150, and the insulation layer 170 are suspended above the carrier plate CA by means of the multi-layer film 160, and the multi-layer film 160 may serve as a tether of the light-emitting element 10. In some embodiments, the first electrode 140 and the second electrode 150 do not contact the carrier plate CA.

Hereinafter, other embodiments of the disclosure will continue to be described with reference to FIG. 2A to FIG. 9B, and the element reference numerals and related contents of the embodiment of FIG. 1 will be used, where the same reference numerals are used to indicate the same or similar elements, and description of the same technical content is omitted. For the description of the omitted part, reference may be made to the aforementioned embodiment in FIG. 1, which will not be repeated.

FIG. 2A to FIG. 2E are schematic cross-sectional views of a step flow of a fabricating method of the light-emitting element 10 of FIG. 1. Hereinafter, a fabricating method of the light-emitting element 10 will be described with reference to FIG. 2A to FIG. 2E.

Figure 2A:
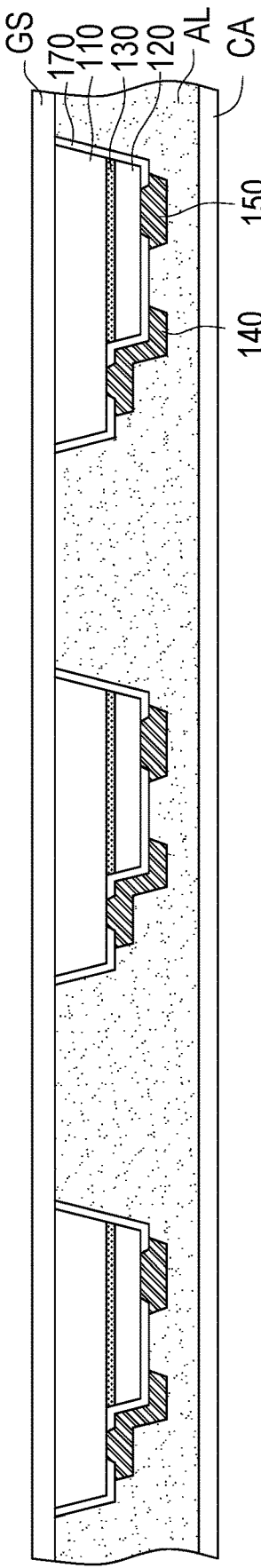
FIG. 2A to FIG. 2E are schematic cross-sectional views of a step flow of a fabricating method of the light-emitting element 10 of FIG. 1.

Referring to FIG. 2A, a semiconductor stacked layer SS, a first electrode 140, a second electrode 150, and an insulation layer 170 grown on a growth substrate GS are provided. The semiconductor stacked layer SS may include the first type semiconductor layer 110, the second type semiconductor layer 120, and the light-emitting layer 130, and the light-emitting layer 130 is located between the first type semiconductor layer 110 and the second type semiconductor layer 120.

In some embodiments, the growth substrate GS is, for example, a sapphire substrate, but the disclosure is not limited thereto. In some embodiments, the method of forming the semiconductor stacked layer SS may include performing an epitaxial process using an appropriate reactant to deposit a desired film, and then patterning the aforementioned film by means of a lithography process and an etching process to form individual sub-layers of the semiconductor stacked layer SS. In some embodiments, a doping process may also be selectively performed on some sub-layers of the semiconductor stacked layer SS.

In some embodiments, the first electrode 140 and the second electrode 150 are electrically connected to different sub-layers in the semiconductor stacked layer SS respectively, and the insulation layer 170 may be located between a part of the first electrode 140 and the semiconductor stacked layer SS and between a part of the second electrode 150 and the semiconductor stacked layer SS, but does not affect the electrical connection between the first electrode 140 and the second electrode 150 and the different sub-layers of the semiconductor stacked layer SS. In some embodiments, the first electrode 140 and the second electrode 150 are located on the same side of the semiconductor stacked layer SS. In some embodiments, the first electrode 140 and the second electrode 150 may be located on different sides of the semiconductor stacked layer SS.

Next, the semiconductor stacked layer SS, the first electrode 140, the second electrode 150, and the insulation layer 170 are adhered to an adhesion layer AL formed on the carrier plate CA, so that the semiconductor stacked layer SS, the first electrode 140, the second electrode 150, and the insulation layer 170 are located between the growth substrate GS and the carrier plate CA, and the semiconductor stacked layer SS, the first electrode 140, the second electrode 150, and the insulation layer 170 are fixed on the carrier plate CA by means of the adhesion layer AL.

In some embodiments, the carrier plate CA may be a rigid substrate, such as a glass substrate, a quartz substrate, or a ceramic substrate, but the disclosure is not limited thereto. In some embodiments, the adhesion layer AL may be formed on the carrier plate CA by means of coating, but the disclosure is not limited thereto. In some embodiments, the adhesion layer AL includes an adhesive photoresist material such as a polyester derivative.

Figure 2B:
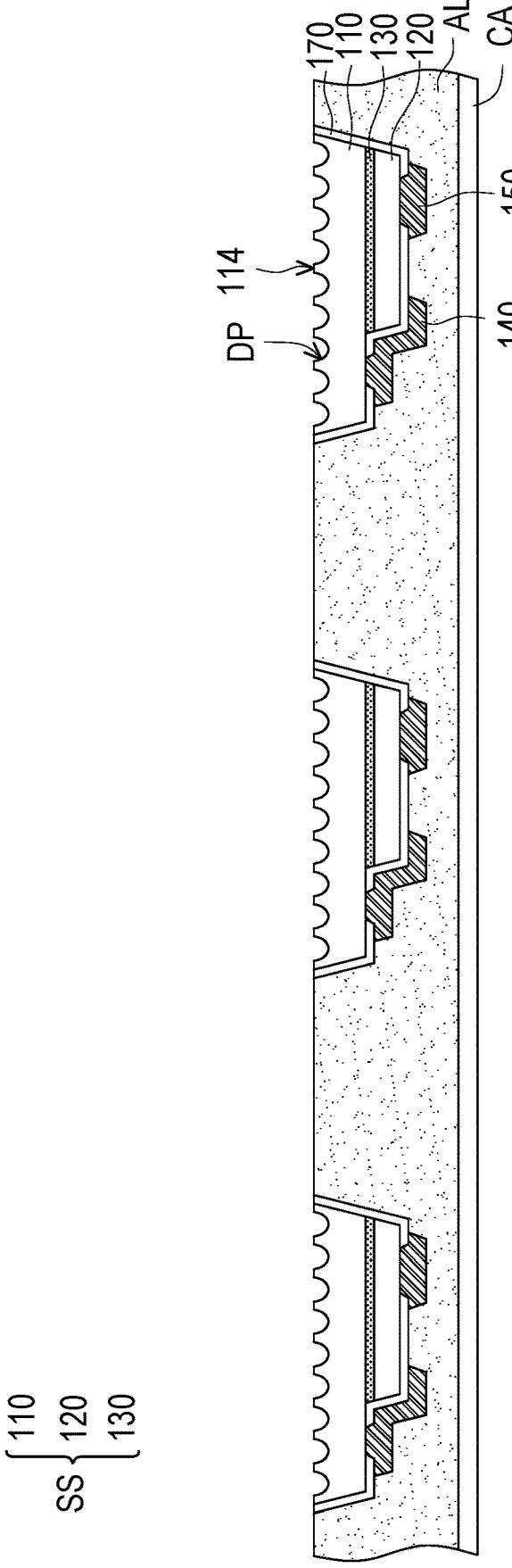

Next, referring to FIG. 2B, the growth substrate GS is removed to expose the first type semiconductor layer 110 in the semiconductor stacked layer SS. The method of removing the growth substrate GS may adopt, for example, a laser lift-off process, but the disclosure is not limited thereto. In some embodiments, the first electrode 140 and the second electrode 150 may be adhered to the adhesion layer AL, and the first electrode 140 and the second electrode 150 may be located between the semiconductor stacked layer SS and the adhesion layer AL. In some embodiments, during the laser lift-off process of the growth substrate GS, the laser light will simultaneously form the multiple notches DP on the surface 114 of the first type semiconductor layer 110.

Figure 2C:
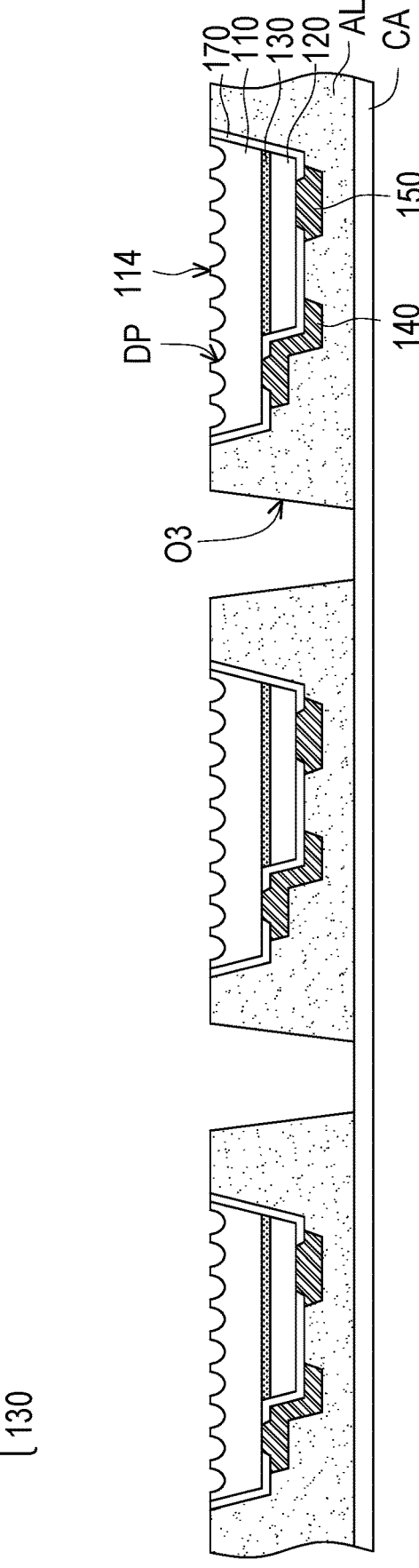

Next, referring to FIG. 2C, the adhesion layer AL may be patterned by using, for example, a photomask and laser light, so as to form multiple openings O3 in the adhesion layer AL. For example, the photomask and the laser light may expose the portion of the adhesion layer AL where the openings O3 are to be formed to the laser light, and the portion exposed to the laser light will be hardened. Afterwards, the hardened portion of the adhesion layer AL may be removed by a development process, and the opening O3 may be formed in the adhesion layer AL. In some embodiments, the opening O3 surrounds the semiconductor stacked layer SS, and the opening O3 is a closed opening. In some embodiments, the multiple openings O3 communicate with each other. In some embodiments, the opening O3 may be formed by laser cutting. In some embodiments, the opening O3 may have a top view profile of a circular polygon (such as a circular quadrangle).

Figure 2D:
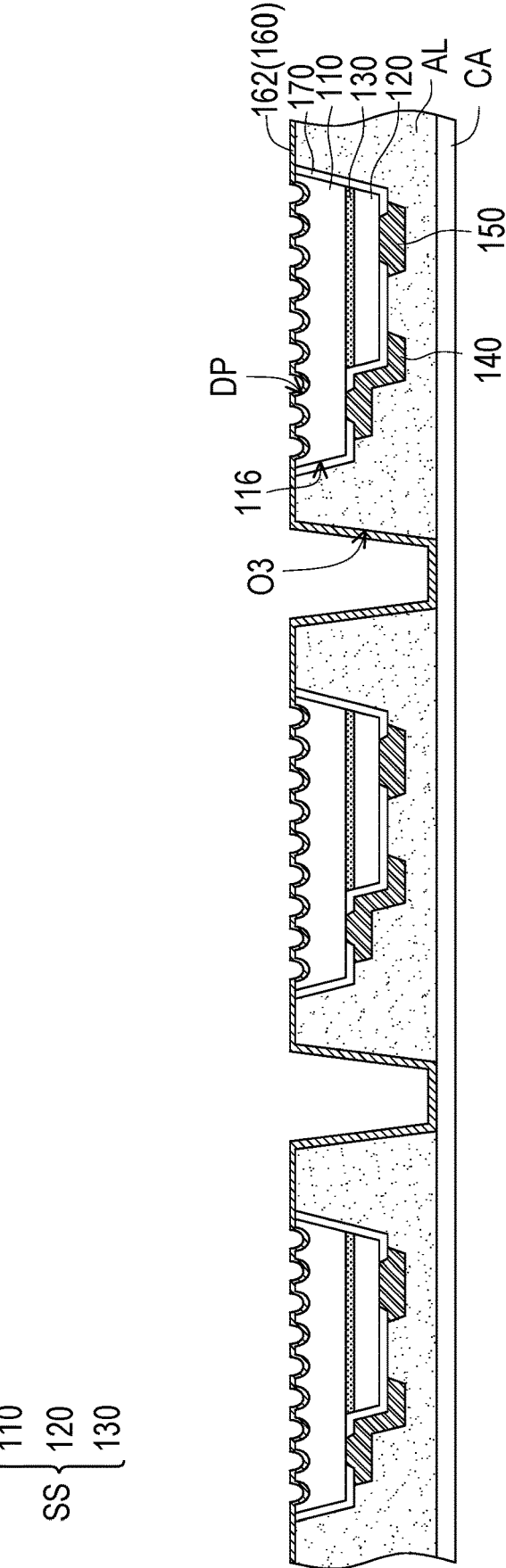

Next, referring to FIG. 2D, the multi-layer film 160 is formed on the surface 114 of the first type semiconductor layer 110 and in the opening O3. In this way, the multi-layer film 160 may be bonded to the surface 114 of the first type semiconductor layer 110, and the protrusion portion 162 of the multi-layer film 160 may extend beyond the surface 114, so that the protrusion 162 protrudes from the side surface 116 of the first type semiconductor layer 110 in the extension direction of the surface 114. In some embodiments, the multi-layer film 160 includes an alternately stacked layer of at least two materials selected from the group consisting of aluminum fluoride, magnesium fluoride, silicon oxide, lanthanum fluoride, gadolinium fluoride, aluminum oxide, yttrium oxide, silicon nitride, hafnium oxide, tantalum pentoxide, zirconia, niobium pentoxide, and titanium dioxide.

Figure 2E:
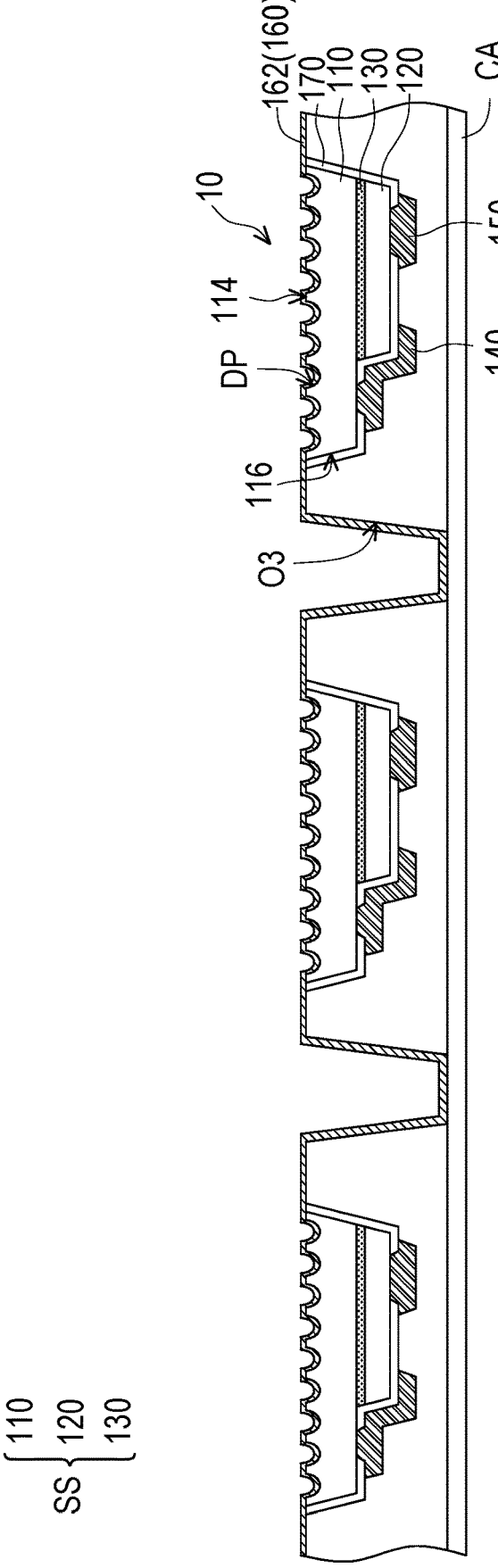

Next, referring to FIG. 2E, after the multi-layer film 160 is formed, the adhesion layer AL may be removed, so that the light-emitting element 10 is suspended above the carrier plate CA by means of the multi-layer film 160. For example, the adhesion layer AL may be removed by exposure and development.

In the light-emitting element 10 of an embodiment of the disclosure, by designing the refractive index and thickness of each sub-layer in the multi-layer film 160, the ratio of the total reflection of the light emitted by the semiconductor stacked layer SS on the light-emitting surface may be reduced, so that the light extraction efficiency of the light-emitting element 10 may be improved. In addition, by adjusting the total thickness of the multi-layer film 160, the supporting strength of the multi-layer film 160 may be controlled, which facilitates the use of multi-layer film 160 as a tether in the mass transfer process of the light-emitting element 10. For example, as shown in Table 1 below, a multi-layer film 160a includes 10 sub-layers alternately stacked by silicon nitride and silicon oxide. The odd-numbered layers are silicon nitride layers, the even-numbered layers are silicon oxide layers, and the total thickness of the multi-layer film 160a is 605.12 nm, which is suitable for the light-emitting element 10 with smaller dimensions. In some embodiments, as shown in Table 2 below, a multi-layer film 160b includes 21 sub-layers alternately stacked by silicon nitride and silicon oxide. The odd-numbered layers are silicon nitride layers, the even-numbered layers are silicon oxide layers, and the total thickness of the multi-layer film 160b is 1077.67 nm, which has a high supporting strength and is suitable for the light-emitting element 10 with large dimensions.

TABLE 1

| Number of sub-layer of multi-layer film 160a | Material | Refractive index | Thickness (nm) |
|---|---|---|---|
| 1 | $Si_3N_4$ | 1.8 | 16.89 |
| 2 | $SiO_2$ | 1.47 | 15.06 |
| 3 | $Si_3N_4$ | 1.8 | 51.3 |
| 4 | $SiO_2$ | 1.47 | 28.85 |
| 5 | $Si_3N_4$ | 1.8 | 63.58 |
| 6 | $SiO_2$ | 1.47 | 27.39 |
| 7 | $Si_3N_4$ | 1.8 | 115.67 |
| 8 | $SiO_2$ | 1.47 | 139.56 |
| 9 | $Si_3N_4$ | 1.8 | 67.07 |
| 10 | $SiO_2$ | 1.47 | 79.74 |
| Total thickness | | | 605.12 |

TABLE 2

| Number of sub-layer of multi-layer film 160b | Material | Refractive index | Thickness (nm) |
|---|---|---|---|
| 1 | $Si_3N_4$ | 1.8 | 91.13 |
| 2 | $SiO_2$ | 1.47 | 49.48 |
| 3 | $Si_3N_4$ | 1.8 | 24.55 |

TABLE 2-continued

| Number of sub-layer of multi-layer film 160b | Material | Refractive index | Thickness (nm) |
|---|---|---|---|
| 4 | $SiO_2$ | 1.47 | 59.64 |
| 5 | $Si_3N_4$ | 1.8 | 45.69 |
| 6 | $SiO_2$ | 1.47 | 37.21 |
| 7 | $Si_3N_4$ | 1.8 | 43.25 |
| 8 | $SiO_2$ | 1.47 | 50.95 |
| 9 | $Si_3N_4$ | 1.8 | 43.34 |
| 10 | $SiO_2$ | 1.47 | 67.49 |
| 11 | $Si_3N_4$ | 1.8 | 37.64 |
| 12 | $SiO_2$ | 1.47 | 55.53 |
| 13 | $Si_3N_4$ | 1.8 | 45.93 |
| 14 | $SiO_2$ | 1.47 | 57.43 |
| 15 | $Si_3N_4$ | 1.8 | 59.21 |
| 16 | $SiO_2$ | 1.47 | 61.57 |
| 17 | $Si_3N_4$ | 1.8 | 20.85 |
| 18 | $SiO_2$ | 1.47 | 67.72 |
| 19 | $Si_3N_4$ | 1.8 | 74.33 |
| 20 | $SiO_2$ | 1.47 | 79.48 |
| 21 | $Si_3N_4$ | 1.8 | 5.26 |
| Total thickness | | | 1077.67 |

Figure 3:
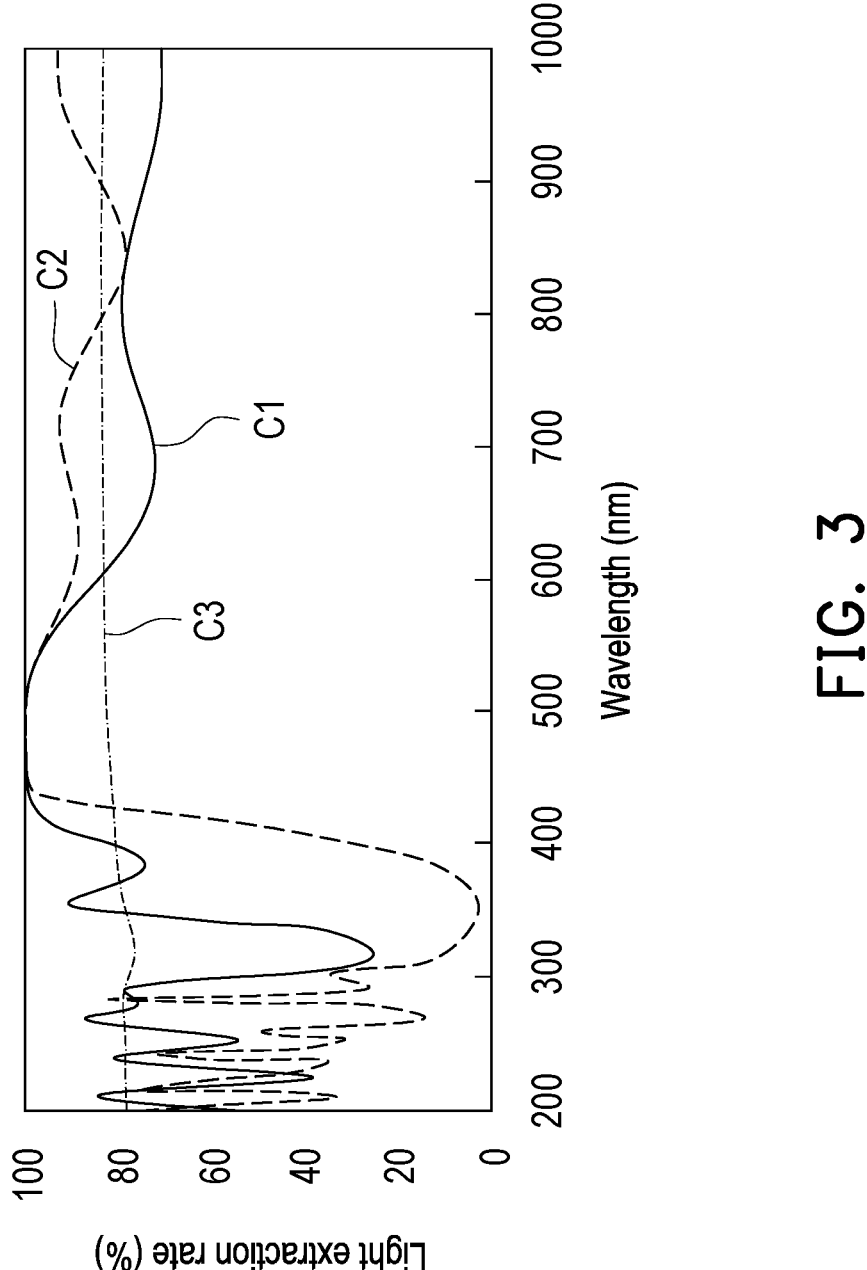
FIG. 3 is a simulation result of a forward light extraction rate of a light-emitting element.

FIG. 3 is a simulation result of a forward light extraction rate of a light-emitting element. A curve C1 represents the simulation result of the forward light extraction rate at the interface of the multi-layer film 160a when the multi-layer film 160 of the light-emitting element 10 shown in FIG. 1 uses the multi-layer film 160a shown in Table 1. A curve C2 shows the simulation result of the forward light extraction rate at the interface of the multi-layer film 160b when the multi-layer film 160 of the light-emitting element 10 shown in FIG. 1 uses the multi-layer film 160b shown in Table 2. A curve C3 represents the simulation result of the forward light extraction rate when the multi-layer film 160 is not disposed in the light-emitting element 10 as shown in FIG. 1. It may be seen from FIG. 3 that when the multi-layer film 160a or the multi-layer film 160b is disposed in the light-emitting element 10, a light extraction rate greater than 98% may be provided for light with a wavelength between 430 nm and 540 nm. However, when there is no multi-layer film disposed in the light-emitting element 10, a light extraction rate of about 80% may only be provided.

Figure 4:
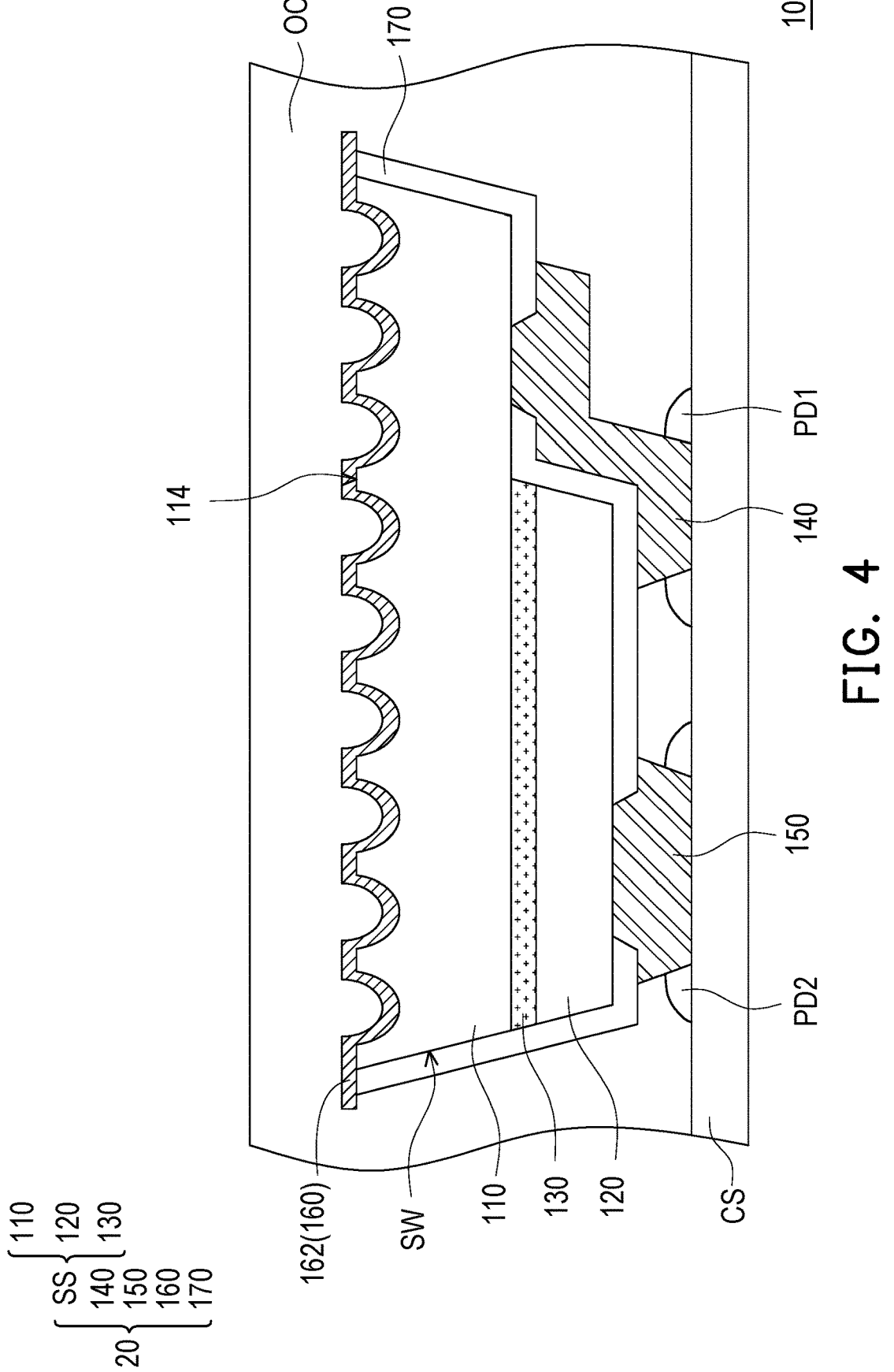
FIG. 4 is a schematic cross-sectional view of a light-emitting device 100 according to an embodiment of the disclosure.

FIG. 4 is a schematic cross-sectional view of a light-emitting device 100 according to an embodiment of the disclosure. Referring to FIG. 4, in some embodiments, a mass transfer process may be performed after the step in FIG. 2E, that is, the semiconductor stacked layer SS, the first electrode 140, the second electrode 150, the insulation layer 170, and a part of the multi-layer film 160 shown in FIG. 2E are grasped and then transferred to a circuit substrate CS. For example, the first electrode 140 may be placed on a pad PD1, and the second electrode 150 may be placed on a pad PD2, so that the first electrode 140 is located between the semiconductor stacked layer SS and the pad PD1 of the circuit substrate CS, and the second electrode 150 is located between the semiconductor stacked layer SS and the pad PD2 of the circuit substrate CS. Afterwards, the first electrode 140 and the second electrode 150 may be electrically connected to the pads PD1 and PD2 respectively by, for example, a heat treatment. So far, the light-emitting device 100 of an embodiment of the disclosure may be completed.

In some embodiments, the circuit substrate CS may include a bottom plate and a stacked layer of a driving circuit layer. The bottom plate of the circuit substrate may be a transparent substrate or a non-transparent substrate, and the material thereof may be a quartz substrate, a glass substrate, a polymer substrate, or other suitable materials, but the disclosure is not limited thereto. The driving circuit layer may include an element or a circuit required by the light-emitting device 100. For example, when the light-emitting device 100 is used as a display device, the driving circuit layer may include an element or a circuit required by the display device, such as a driving element, a switching element, a storage capacitor, a power line, a driving signal line, a timing signal line, a current compensation line, or a detection signal line.

In some embodiments, the light-emitting device 100 includes the circuit substrate CS; and multiple light-emitting elements 20 disposed on the circuit substrate CS and electrically connected to the circuit substrate CS. The light-emitting element 20 may include the semiconductor stacked layer SS, the first electrode 140, the second electrode 150, the insulation layer 170, and the multi-layer film 160. The first electrode 140 is electrically connected to the first type semiconductor layer 110 in the semiconductor stacked layer SS and the pad PD1 of the circuit substrate CS, and the second electrode 150 is electrically connected to the second type semiconductor layer 120 in the semiconductor stacked layer SS and the pad PD2 of the circuit substrate CS. In some embodiments, the semiconductor stacked layer SS is located between the multi-layer film 160 and the circuit substrate CS, and the protrusion portion 162 of the multi-layer film 160 protrudes from a side surface SW of the semiconductor stacked layer SS. In some embodiments, the semiconductor stacked layer SS further includes the light-emitting layer 130, and the light-emitting layer 130 is located between the first type semiconductor layer 110 and the second type semiconductor layer 120. In some embodiments, the light exiting surface 114 of the semiconductor stacked layer SS faces the multi-layer film 160. Since the multi-layer film 160 helps to reduce the ratio of the total reflection of the light emitted by the semiconductor stacked layer SS on the light exiting surface 114, the light extraction rate of the light-emitting device 100 may be increased to over 98%.

In some embodiments, the light-emitting device 100 further includes an optical layer OC, and the multi-layer film 160 is located between the optical layer OC and the first type semiconductor layer 110. The optical layer OC may not only improve the light extraction rate of the light-emitting device 100, but also provide protection for the light-emitting element 20. In some embodiments, the refractive index of the optical layer OC is between the refractive index of the sub-layer of the multi-layer film 160 and the refractive index of air, and the optical layer OC may further improve the light extraction rate of the light-emitting device 100 to over 99%.

Figure 5B:
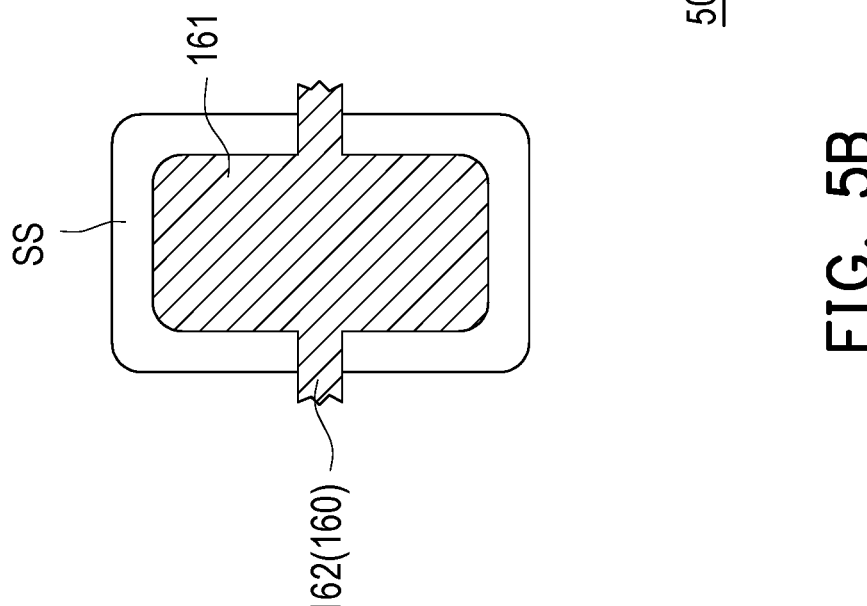
FIG. 5B is a schematic top view of a light-emitting element 50 according to an embodiment of the disclosure.
Figure 5A:
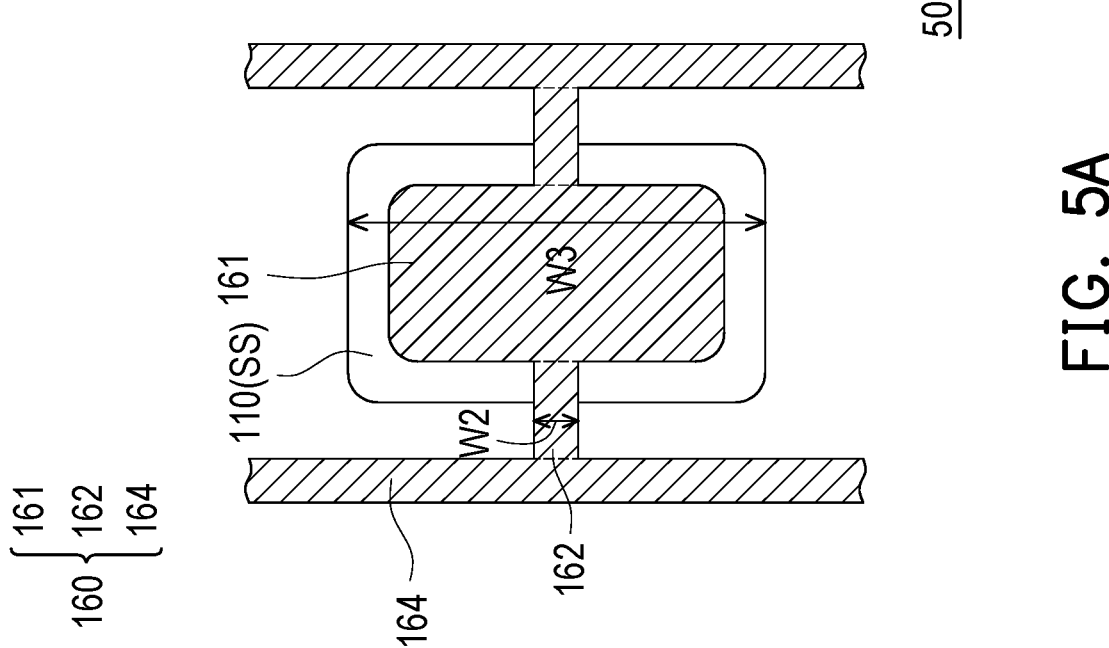
FIG. 5A is a schematic top view of a light-emitting element 50' according to an embodiment of the disclosure.

FIG. 5A is a schematic top view of a light-emitting element 50' according to an embodiment of the disclosure. In some embodiments, the multi-layer film 160 of the light-emitting element 50' includes a light guide portion 161, the protrusion portion 162, and the support portion 164. The light guide portion 161 completely overlaps the semiconductor stacked layer SS, the protrusion portion 162 may extend from above the semiconductor stacked layer SS to the outside of the semiconductor stacked layer SS, and the support portion 164 does not overlap the semiconductor stacked layer SS. In some embodiments, the protrusion portion 162 connects the light guide portion 161 and the support portion 164. In some embodiments, the semiconductor stacked layer SS has a rectangular profile, and the protrusion portion 162 overlaps the long side of the semiconductor stacked layer SS, but the disclosure is not limited thereto. In some embodiments, the ratio of a width W2 of the protrusion portion 162 to a length W3 of the first type semiconductor layer 110 of the semiconductor stacked layer SS is 5% to 95%, such as 10%, 35%, or 60%.

FIG. 5B is a schematic top view of a light-emitting element 50 according to an embodiment of the disclosure. In some embodiments, the light-emitting element 50 is formed by disconnecting the protrusion portion 162 and the support portion 164 after the light-emitting element 50' of FIG. 5A is grasped. In some embodiments, after the protrusion portion 162 and the support portion 164 are disconnected, a part of the protrusion portion 162 is still connected to the light guide portion 161.

Figure 6A:
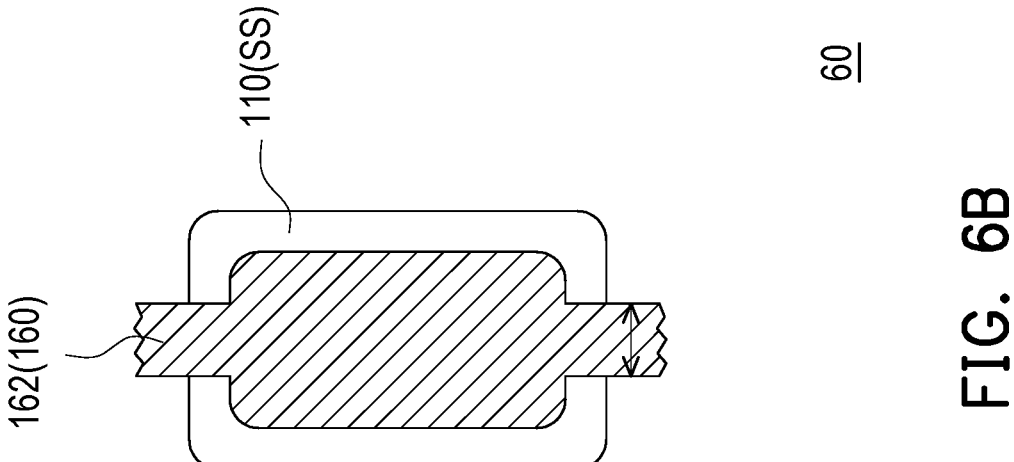
FIG. 6A is a schematic top view of a light-emitting element 60' according to an embodiment of the disclosure.
Figure 6B:
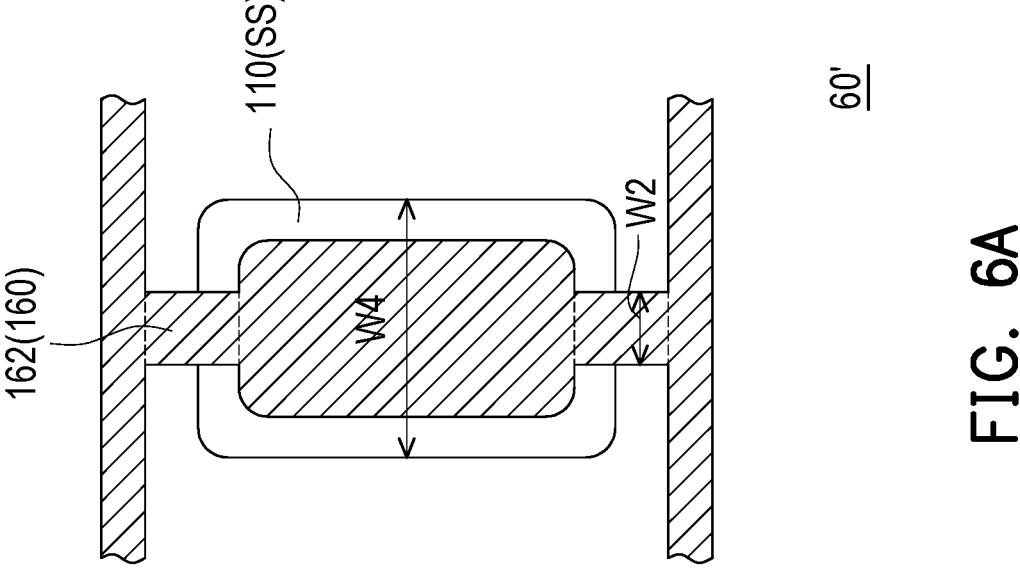
FIG. 6B is a schematic top view of a light-emitting device 60 according to an embodiment of the disclosure.

FIG. 6A is a schematic top view of a light-emitting element 60' according to an embodiment of the disclosure. FIG. 6B is a schematic top view of a light-emitting device 60 according to an embodiment of the disclosure. Compared with the light-emitting elements 50' and 50 shown in FIG. 5A to FIG. 5B, the difference of the light-emitting elements 60' and 60 shown in FIG. 6A to FIG. 6B mainly lies in the protrusion portion 162 of the multi-layer film 160 of the light-emitting elements 60' and 60 overlapping the short side of the semiconductor stacked layer SS. In some embodiments, the ratio of the width W2 of the protrusion portion 162 to a width W4 of the first type semiconductor layer 110 of the semiconductor stacked layer SS is 5% to 95%, such as 30%, 50%, or 80%. When the ratio of the width W2 to the width W4 is larger, the protrusion portion 162 of the multi-layer film 160 may provide a greater supporting strength, and thus may support a heavy light-emitting element 60'.

Figure 7A:
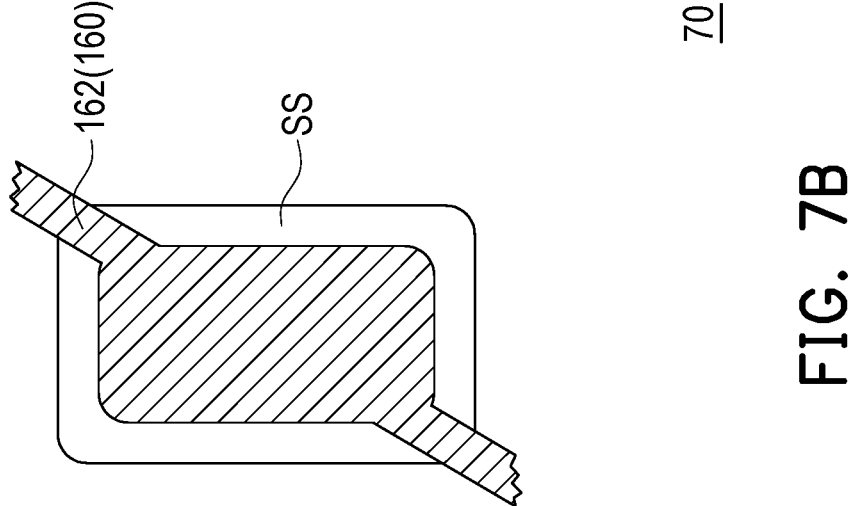
FIG. 7A is a schematic top view of a light-emitting element 70' according to an embodiment of the disclosure.
Figure 7B:
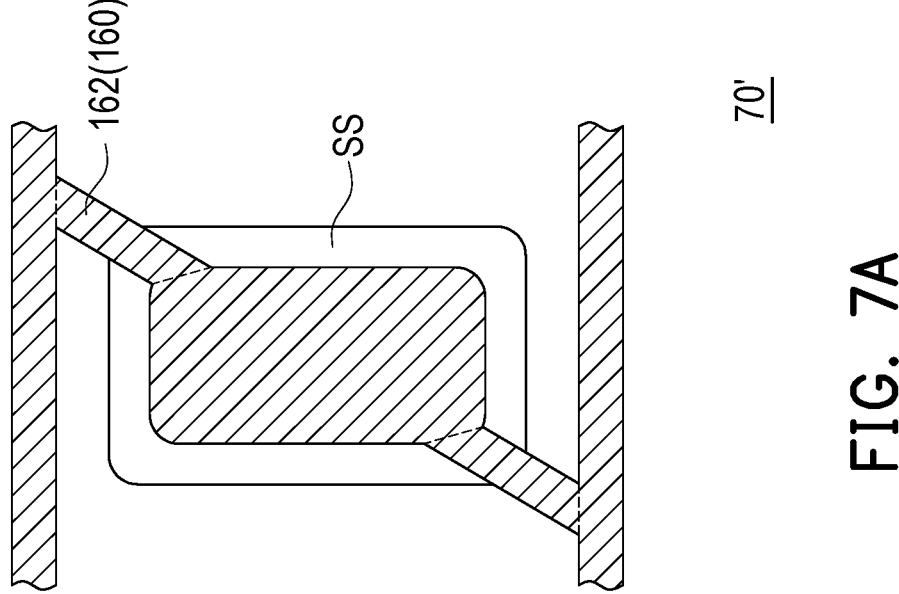
FIG. 7B is a schematic top view of a light-emitting device 70 according to an embodiment of the disclosure.

FIG. 7A is a schematic top view of a light-emitting element 70' according to an embodiment of the disclosure. FIG. 7B is a schematic top view of a light-emitting device 70 according to an embodiment of the disclosure. Compared with the light-emitting elements 50' and 50 shown in FIG. 5A to FIG. 5B, the difference of the light-emitting elements 70' and 70 shown in FIG. 7A to FIG. 7B mainly lies in the protrusion portion 162 of the multi-layer film 160 overlapping the two opposite corners with regard to a diagonal line of the semiconductor stacked layer SS.

Figure 8B:
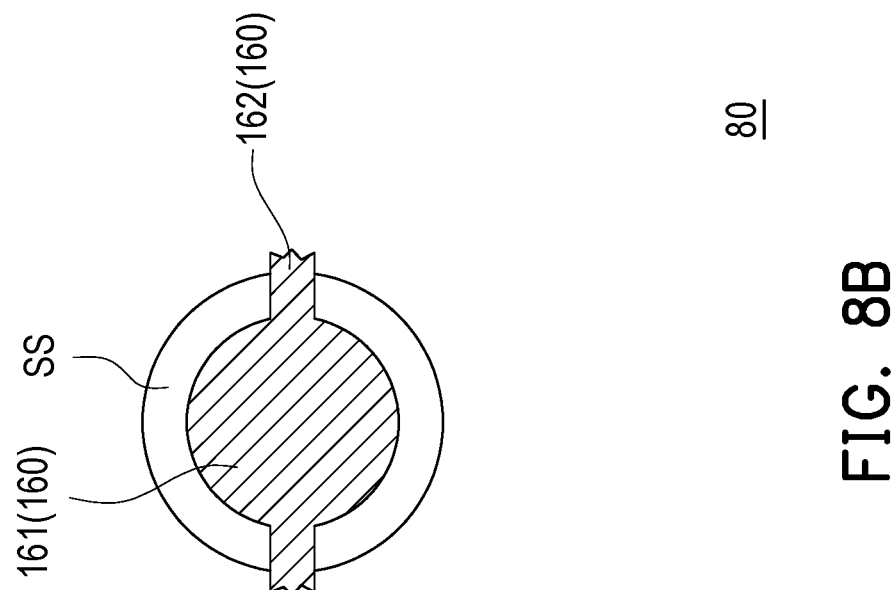
FIG. 8B is a schematic top view of a light-emitting device 80 according to an embodiment of the disclosure.
Figure 8A:
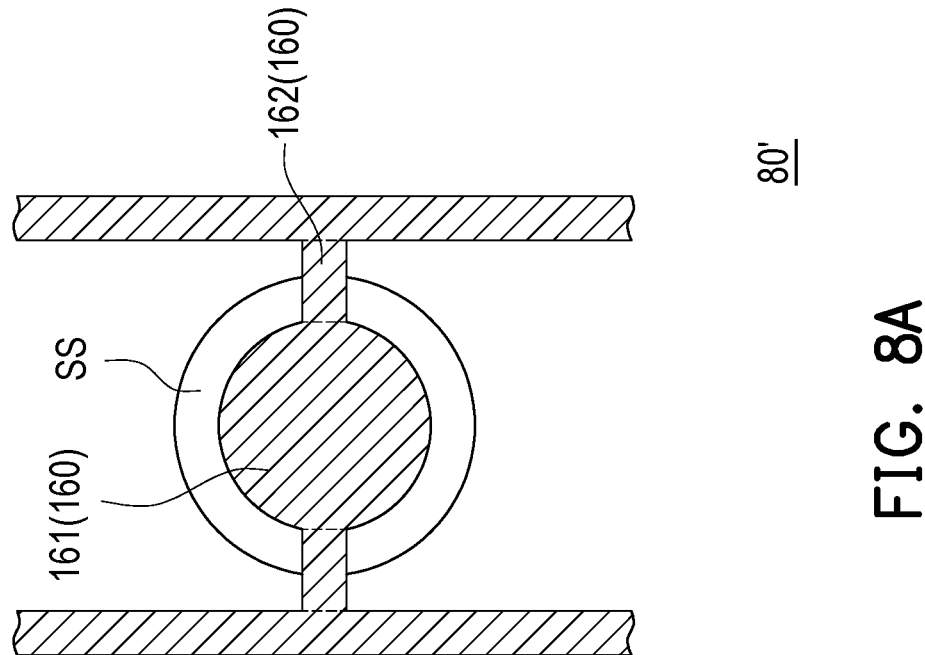
FIG. 8A is a schematic top view of a light-emitting element 80' according to an embodiment of the disclosure.

FIG. 8A is a schematic top view of a light-emitting element 80' according to an embodiment of the disclosure. FIG. 8B is a schematic top view of a light-emitting device 80 according to an embodiment of the disclosure. Compared with the light-emitting elements 50' and 50 shown in FIG. 5A to FIG. 5B, the difference of the light-emitting elements 80' and 80 shown in FIG. 8A to FIG. 8B mainly lies in the semiconductor stacked layer SS of the light-emitting elements 80' and 80 having a round top view profile. In some embodiments, the semiconductor stacked layer SS has a square, ellipse, polygonal, or irregular top view profile. In some embodiments, the area of the light guide portion 161 of the multi-layer film 160 is less than the area of the semiconductor stacked layer SS, but the disclosure is not limited thereto. In some embodiments, the area of the light guide portion 161 is substantially equal to the area of the semiconductor stacked layer SS.

Figure 9B:
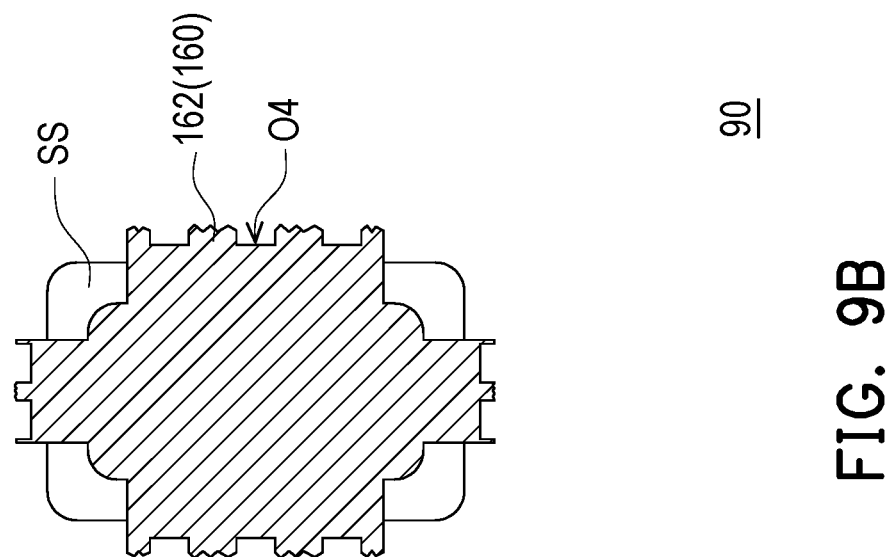
FIG. 9B is a schematic top view of a light-emitting element 90 according to an embodiment of the disclosure.
Figure 9A:
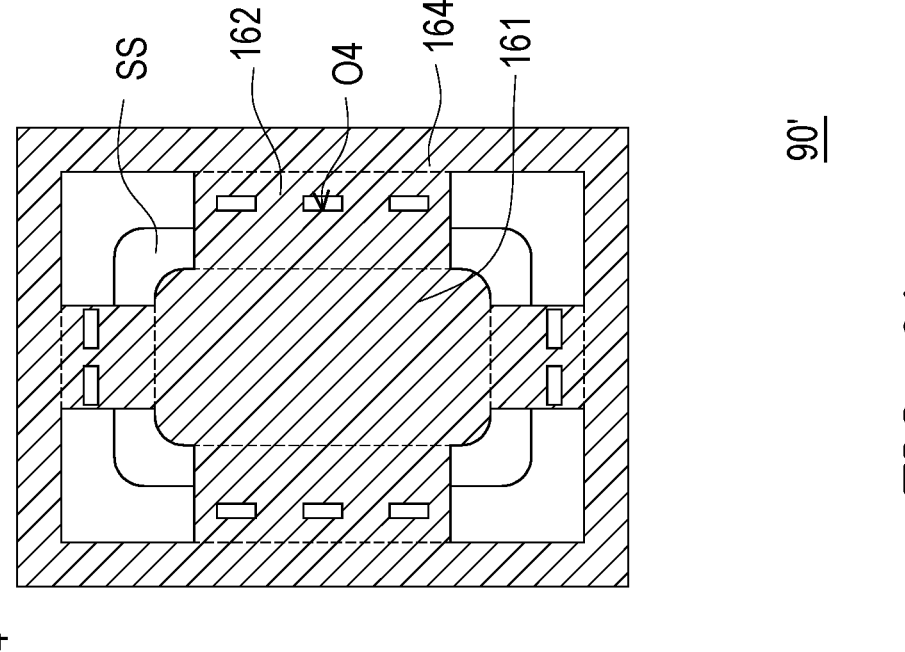
FIG. 9A is a schematic top view of a light-emitting element 90' according to an embodiment of the disclosure.

FIG. 9A is a schematic top view of a light-emitting element 90' according to an embodiment of the disclosure. FIG. 9B is a schematic top view of a light-emitting element 90 according to an embodiment of the disclosure. Compared with the light-emitting elements 50' and 50 shown in FIG. 5A to FIG. 5B, the difference of the light-emitting elements 90' and 90 shown in FIG. 9A to FIG. 9B mainly lies in some of the protrusion portions 162 among the multiple protrusion portions 162 of the multi-layer film 160 overlapping the long sides of the semiconductor stacked layer SS, and the other protrusion portions 162 of the multiple protrusion portions 162 overlapping the short sides of the semiconductor stacked layer SS.

In some embodiments, the protrusion portion 162 of the multi-layer film 160 also has a weakened structure, so as to reduce the fracture strength of the protrusion portion 162. For example, the protrusion portion 162 has at least an opening O4, and the opening O4 does not overlap the semiconductor stacked layer SS. The opening O4 may weaken the structural strength of the protrusion portion 162, so that when the light-emitting elements 90' and 90 are grasped, the protrusion portion 162 and the support portion 164 are easily disconnected.

In summary, the light-emitting element and the light-emitting device of the disclosure may avoid the total reflection of the light emitted by the light-emitting element on the light exiting surface by disposing the multi-layer film on the light exiting surface of the semiconductor stacked layer, thereby improving the light extraction efficiency of the light-emitting element and the light-emitting device. In addition, the light-emitting element of the disclosure uses a multi-layer film as a tether, which may also facilitate the mass transfer process of the light-emitting element to fabricate a light-emitting device.

Although the disclosure has been described with reference to the embodiments above, the embodiments are not intended to limit the disclosure. Any person skilled in the art may make some changes and modifications without departing from the spirit and scope of the disclosure. Therefore, the scope of the present disclosure will be defined in the appended claims.

What is claimed is:

1. A light-emitting element, comprising:
a first type semiconductor layer;
a second type semiconductor layer, overlapping the first type semiconductor layer;

a light-emitting layer, located between the first type semiconductor layer and the second type semiconductor layer;
a first electrode, electrically connected to the first type semiconductor layer, and located on a side of the first type semiconductor layer close to the second type semiconductor layer;
a second electrode, electrically connected to the second type semiconductor layer, and located on a side of the second type semiconductor layer facing away from the first type semiconductor layer;
an anti-reflective layer, located on a surface of the first type semiconductor layer facing away from the second type semiconductor layer, and having a protrusion portion, wherein the protrusion portion protrudes from a side surface of the first type semiconductor layer; and
a carrier plate, wherein the carrier plate is located on the side of the second type semiconductor layer facing away from the first type semiconductor layer, and the anti-reflective layer is connected to the carrier plate, so that the first type semiconductor layer, the second type semiconductor layer, the light-emitting layer, the first electrode, and the second electrode are suspended above the carrier plate by means of the anti-reflective layer.

2. The light-emitting element according to claim 1, wherein a ratio of a width of the protrusion portion of the anti-reflective layer to a width of the first type semiconductor layer is 5% to 95%.

3. The light-emitting element according to claim 1, wherein the surface of the first type semiconductor layer facing away from the second type semiconductor layer has a plurality of notches, and the anti-reflective layer is bonded to the plurality of notches.

4. The light-emitting element according to claim 3, wherein diameters of the plurality of notches are 0.1 μm to 30 μm.

* * * * *